US012648360B2

(12) United States Patent
Nakamura

(10) Patent No.: US 12,648,360 B2
(45) Date of Patent: Jun. 2, 2026

(54) PIEZOELECTRIC LAMINATE AND PIEZOELECTRIC ELEMENT

(71) Applicant: FUJIFILM Corporation, Tokyo (JP)

(72) Inventor: Seigo Nakamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 745 days.

(21) Appl. No.: 18/184,045

(22) Filed: Mar. 15, 2023

(65) Prior Publication Data

US 2023/0301193 A1 Sep. 21, 2023

(30) Foreign Application Priority Data

Mar. 17, 2022 (JP) ................................. 2022-043033

(51) Int. Cl.
*H10N 30/853* (2023.01)
*C01G 25/00* (2006.01)

(52) U.S. Cl.
CPC ....... *H10N 30/8554* (2023.02); *C01G 25/006* (2013.01); *C01P 2002/34* (2013.01); (Continued)

(58) Field of Classification Search
CPC ...... B41J 2/14233; B41J 2/161; B41J 2/1612; C01G 25/006; C01P 2002/34; C01P 2002/54; C01P 2002/72; C01P 2002/76; C01P 2006/40; H10N 30/076; H10N 30/093; H10N 30/704; H10N 30/853; H10N 30/8542; H10N 30/8548; H10N 30/8554
See application file for complete search history.

(56) References Cited

U.S. PATENT DOCUMENTS 6,411,017 B1 6/2002 Qiu et al.
2005/0127795 A1 6/2005 Torii et al.
(Continued)

FOREIGN PATENT DOCUMENTS

JP 11-307833 A 11/1999
JP 2005-203725 A 7/2005
(Continued)

OTHER PUBLICATIONS

Japanese Office Action for corresponding Japanese Application No. 2022-043033, dated Sep. 30, 2025, with English translation.
(Continued)

*Primary Examiner* — Levi Gannon
(74) *Attorney, Agent, or Firm* — Birch, Stewart, Kolasch & Birch, LLP

(57) ABSTRACT

There are provided a piezoelectric laminate, which include, on a substrate in the following order, a lower electrode layer and a piezoelectric film, in which the piezoelectric film contains a perovskite-type oxide, the piezoelectric film includes a first region in which the perovskite-type oxide contains, as a main component, a first perovskite crystal in which a first angle formed by a (100) plane orientation or a (001) plane orientation and a normal direction of a surface of the substrate is 5°~30°, and includes a second region provided between the first region and the lower electrode layer, in which the perovskite-type oxide contains, as a main component, a second perovskite crystal in which a second angle formed by the (100) plane orientation or the (001) plane orientation and the normal direction is less than 5°, and a thickness of the second region is 30 nm or more.

11 Claims, 4 Drawing Sheets

(52) U.S. Cl.
    CPC ...... *C01P 2002/54* (2013.01); *C01P 2002/72*
        (2013.01); *C01P 2002/76* (2013.01); *C01P*
        *2006/40* (2013.01)

(56)                    References Cited

U.S. PATENT DOCUMENTS

| 2010/0320874 | A1 | 12/2010 | Suenaga et al. |
| 2011/0215679 | A1 | 9/2011 | Naono |
| 2016/0099402 | A1 | 4/2016 | Mizukami et al. |
| 2019/0123257 | A1 | 4/2019 | Kijima |

FOREIGN PATENT DOCUMENTS

| JP | 2011-181828 A | 9/2011 |
| JP | 2015-26676 A | 2/2015 |
| JP | 2016-72568 A | 5/2016 |
| JP | 2016-72571 A | 5/2016 |
| JP | 2020-202327 A | 12/2020 |
| WO | WO 2017/221649 A1 | 12/2017 |

OTHER PUBLICATIONS

Extended European Search Report for corresponding European Application No. 23161496.7, dated Aug. 7, 2023.
Japanese Office Action for corresponding Japanese Application No. 2022-043033, dated Jan. 6, 2026, with English translation.

EXAMPLE 2

EXAMPLE 2: FIRST REGION

EXAMPLE 2: SECOND REGION

1

PIEZOELECTRIC LAMINATE AND PIEZOELECTRIC ELEMENT

CROSS REFERENCE TO RELATED APPLICATIONS

This application claims priority from Japanese Patent Application No. 2022-043033 filed on Mar. 17, 2022, the entire disclosure of which is incorporated by reference.

BACKGROUND

1. Technical Field

The present disclosure relates to a piezoelectric laminate and a piezoelectric element.

2. Related Art

As a material having excellent piezoelectric characteristics and excellent ferroelectricity, there is known a perovskite-type oxide such as lead zirconate titanate ($Pb(Zr,Ti)O_3$, hereinafter referred to as PZT). A piezoelectric body consisting of a perovskite-type oxide is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, a piezoelectric micromachined ultrasonic transducer (PMUT), and an oscillation power generation device.

In a case of applying a piezoelectric element to a device, it is desirable that the piezoelectric element has high piezoelectric characteristics because higher piezoelectric characteristics lead to power saving.

In order to obtain a high piezoelectric constant, JP1999-307833A (JP-H11-307833A) and JP2011-181828A propose to laminate PZT having a crystal axis tilted by 5° or more from the normal direction of a surface of a substrate.

As in JP1999-307833A (JP-H11-307833A) and JP2011-181828A, a PZT film having a tilted crystal axis can realize a high piezoelectric constant. On the other hand, studies by the inventors of the present invention revealed a problem that a PZT film in which the crystal axis is tilted by 5° or more has a low withstand voltage as compared with a PZT film in which the crystal axis is perpendicular to a substrate surface.

SUMMARY

The technology according to the present disclosure has been made in consideration of the above circumstances, and an object of the present invention is to provide a piezoelectric laminate and a piezoelectric element, which have both a high piezoelectric constant and a high withstand voltage.

Specific means for achieving the above object include the following aspects.

The piezoelectric laminate according to the present disclosure is a piezoelectric laminate comprising, on a substrate in the following order, a lower electrode layer and a piezoelectric film, in which the piezoelectric film contains a perovskite-type oxide, the piezoelectric film includes a first region in which the perovskite-type oxide contains, as a main component, a first perovskite crystal in which a first angle formed by a (100) plane orientation or a (001) plane orientation and a normal direction of a surface of the substrate is 5° or more and 30° or less, and includes a second region provided between the first region and the lower electrode layer, in which the perovskite-type oxide contains, as a main component, a second perovskite crystal in which a second angle formed by the (100) plane orientation or the (001) plane orientation and the normal direction is less than 5°, and a thickness of the second region is 30 nm or more.

In the piezoelectric laminate according to the present disclosure, it is preferable that in the first region of the piezoelectric film, the first angle is 5° or more and 15° or less.

In the piezoelectric laminate according to the present disclosure, it is preferable that the piezoelectric film does not have a grain boundary between the first region and the second region, which is caused by lamination and is substantially parallel to the substrate.

In the piezoelectric laminate according to the present disclosure, it is preferable that the piezoelectric film is a sputter film.

In the piezoelectric laminate according to the present disclosure, it is preferable that the thickness of the first region of the piezoelectric film is 1 μm or more.

In the piezoelectric laminate according to the present disclosure, it is preferable that in the first perovskite crystal in the first region, a plane orientation that forms the first angle with the normal direction is the (100) plane orientation.

In the piezoelectric laminate according to the present disclosure, it is preferable that the first perovskite crystal in the first region is rhombohedral.

In the piezoelectric laminate according to the present disclosure, it is preferable that the perovskite-type oxide is represented by General Formula $ABO_3$, where A is an A site element, B is a B site element, and O is an oxygen element, and a main component of the A site element is Pb.

In the piezoelectric laminate according to the present disclosure, it is preferable that the perovskite-type oxide is a compound represented by General Formula (1), $$Pb\{(Zr_xTi_{1-x})_{y-1}B1_y\}O_3 \qquad (1)$$

$0 < x < 1$, $0 < y < 0.4$, and

B1 is one or more elements selected from V, Nb, Ta, Sb, Mo, and W.

In the piezoelectric laminate according to the present disclosure, it is preferable that a Pb compositional ratio in the second region is larger than a Pb compositional ratio in the first region.

The piezoelectric element according to the present disclosure has the piezoelectric laminate according to the present disclosure and an upper electrode layer provided on the piezoelectric film of the piezoelectric laminate.

According to the piezoelectric laminate and the piezoelectric element according to the present disclosure, both a high piezoelectric constant and a high withstand voltage can be achieved.

DETAILED DESCRIPTION

Figure 1:
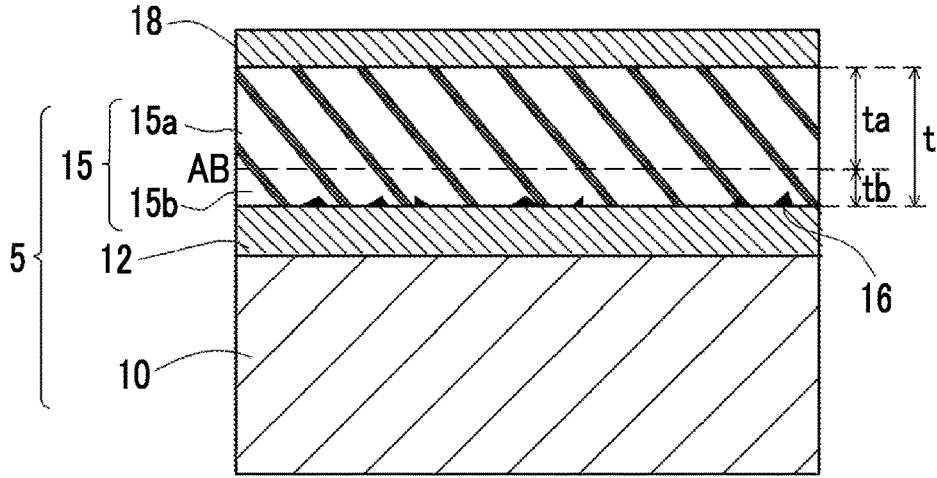
FIG. 1 is a cross-sectional view illustrating a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

Figure 2:
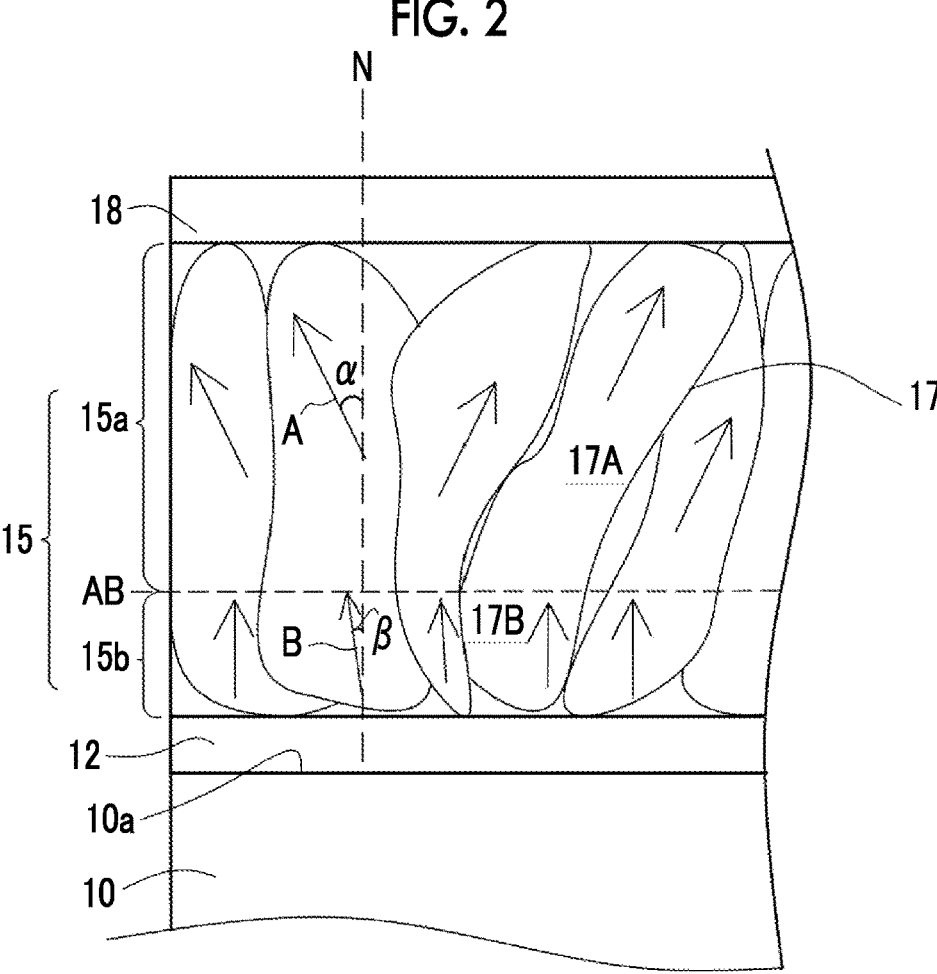
FIG. 2 is an explanatory view of an alignment state of the piezoelectric film.

FIG. 1 is a schematic cross-sectional view illustrating layer configurations of a piezoelectric laminate 5 and a piezoelectric element 1 having the piezoelectric laminate 5, according to a first embodiment, and FIG. 2 is a view schematically illustrating an alignment state of a piezoelectric film 15. As illustrated in FIG. 1, the piezoelectric element 1 has the piezoelectric laminate 5 and an upper electrode layer 18. The piezoelectric laminate 5 has a substrate 10 and a piezoelectric film 15 laminated on the substrate 10, where the piezoelectric film 15 includes a lower electrode layer 12 and contains a perovskite-type oxide. Here, "lower" and "upper" do not respectively mean top and bottom in the vertical direction. As result, an electrode disposed on the side of the substrate 10 with the piezoelectric film 15 being interposed is merely referred to as the lower electrode layer 12, and an electrode disposed on the side of the piezoelectric film 15 opposite to the substrate 10 is merely referred to as the upper electrode layer 18.

The piezoelectric film 15 contains a perovskite-type oxide. In the present specification, "contains a perovskite-type oxide" means that 80% by mole or more of the piezoelectric film 15 is a perovskite-type oxide. It is noted that it is preferable that the perovskite-type oxide occupies 90% by mole or more of the piezoelectric film 15. Further, it is preferable that the piezoelectric film 15 consists of a perovskite structure-type oxide (however, it contains unavoidable impurities).

The piezoelectric film 15 includes a first region 15a that forms a main part, and a second region 15b that is provided between the first region 15a and the lower electrode layer 12. In addition, another layer such as an alignment control layer may be provided between the lower electrode layer 12 and the second region 15b.

As shown in FIG. 2, in the first region 15a, the perovskite-type oxide constituting the first region 15a contains, as a main component, a first perovskite crystal 17A in which a first angle α formed by a (100) plane orientation or (001) plane orientation indicated by an arrow A and a normal direction N of a surface 10a of the substrate 10 (hereinafter, referred to as a substrate surface 10a) is 5° or more and 30° or less. The first angle α is preferably 5° or more and 150 or less.

As shown in FIG. 2, in the second region 15b, the perovskite-type oxide constituting the second region 15b contains, as a main component, a second perovskite crystal 17B in which an angle R formed by a (100) plane orientation or (001) plane orientation indicated by an arrow B and the normal direction N of the substrate surface 10a is 5° or less. The thickness tb (see FIG. 1) of the second region 15b is 30 nm or more, and it is more preferably 100 nm or more and 500 nm or less. It is noted that the angle R may be 0°, and in a case where the angle β is 0°, the (100) plane orientation or the (001) plane orientation is parallel to the normal direction N.

The (100) plane orientation is the normal direction of the (100) plane and means the <100> direction. Similarly, the (001) plane orientation is the normal direction of the (001) plane and means the <001> direction.

The first perovskite crystal 17A in which the first angle α formed by the (100) plane orientation and the normal direction N of the substrate surface 10a is 5° or more and 30° or less is a perovskite crystal in a preferential alignment in terms of the (100) plane, that is, in an alignment in terms of the a axis, which is a perovskite crystal in which the tilt angle from the normal direction of the a axis is 5° or more and 30° or less. Similarly, the first perovskite crystal 17A in which the first angle α formed by the (001) plane orientation and the normal direction N of the substrate surface 10a is 5° or more and 30° or less is a perovskite crystal in a preferential alignment in terms of the (001) plane, that is, in an alignment in terms of the c axis, which is a perovskite crystal in which the tilt angle from the normal direction of the c axis is 5° or more and 30° or less. In a case where the first perovskite crystal 17A is in a preferential alignment in terms of the (100) plane, the arrow A in FIG. 2 indicates the (100) plane orientation, that is, the a axis, and in a case where the first perovskite crystal 17A is in a preferential alignment in terms of the (001) plane, the arrow A in FIG. 2 indicates the (001) plane orientation, that is, the c axis. Hereinafter, the arrow A will be referred to as a crystal axis A. It is noted that it is preferable that in the first perovskite crystal 17A, the (100) plane orientation among the (100) plane orientation and the (001) plane orientation has a tilt of the normal direction N and the first angle α, that is, the first perovskite crystal 17A is an alignment in terms of the a axis.

The second perovskite crystal 17B in which the second angle β formed by the (100) plane orientation and the normal direction N of the substrate surface 10a is less than 5° is a perovskite crystal in a preferential alignment in terms of the (100) plane, that is, in an alignment in terms of the a axis, which is a perovskite crystal in which the tilt angle from the normal direction of the a axis is less than 5°. Similarly, the second perovskite crystal 17B in which the second angle β formed by the (001) plane orientation and the normal direction N of the substrate surface 10a is less than 5° is a perovskite crystal in a preferential alignment in terms of the (001) plane, that is, in an alignment in terms of the c axis, which is a perovskite crystal in which the tilt angle from the normal direction of the c axis is less than 5°. In a case where the second perovskite crystal 17B is in a preferential alignment in terms of the (100) plane, the arrow B in FIG. 2 means the a axis, and in a case where the second perovskite crystal 17B is in a preferential alignment in terms of the (001) plane, the arrow B in FIG. 2 means the c axis. Hereinafter, the arrow B will be referred to as a crystal axis B.

In the present embodiment, as shown in FIG. 2, the piezoelectric film 15 is composed of a large number of columnar crystal grains 17 that extend in the thickness direction. As shown in FIG. 2, even in the case of the crystal grains 17 that extend from the first region 15a to the second region 15b, the first perovskite crystal 17A in which the crystal axis A is tilted by the first angle α from the normal direction N, is contained as a main component in the first region 15a, and the second perovskite crystal 17B in which the crystal axis B is tilted by the second angle β from the normal direction N, is contained as a main component in the second region 15b.

As shown in FIG. 2, in the piezoelectric film 15, it is preferable that the boundary AB between the first region 15a and the second region 15b does not have a clear grain boundary (a crystal grain boundary).

The preferential alignment in terms of the (100) plane or the preferential alignment in terms of the (001) plane means that, between a (100) peak and a (200) peak or between a (001) peak and a (002) peak in an X-ray diffraction (XRD) chart, other peaks due to the perovskite structure are not observed, or a (100) or (001) peak or a (200) or (002) peak is the maximum even in a case where there are other peaks due to the perovskite structure.

It is noted that in a case where the perovskite crystal is rhombohedral, the (100) plane and the (001) plane are equivalent, and the two are not distinguished from each other. On the other hand, in a case where the lattice constants of the a axis and the c axis are close to each other even in a case where the perovskite crystal is tetragonal, the 2θ positions of the (100) peak and the (001) peak substantially match, and thus it is difficult to distinguish the two from each other in a general XRD analysis using a copper (Cu) tubular bulb and using the characteristic X-ray CuKα. However, it can be confirmed from an XRD chart obtained from a general XRD measurement that the alignment is a preferential alignment in terms of the (100) plane or a preferential alignment in terms of the (001) plane.

The perovskite structure may be tetragonal, orthorhombic, monoclinic, trigonal, or rhombohedral. In the piezoelectric laminate 5 and the piezoelectric element 1 according to the present embodiment, the first perovskite crystal 17A is preferably tetragonal, rhombohedral, or a mixed crystal of a tetragonal crystal and a rhombohedral crystal, and it is particularly preferably rhombohedral. It is said that a piezoelectric perovskite-type oxide exhibits a high piezoelectric constant at or in the vicinity of the morphotropic phase boundary (MPB). For example, it is said that in PZT, the composition having a molar ratio of Zr/Ti=52/48 is the MPB composition, and the piezoelectric constant is the highest. It is said that MPB is in a state of a mixed crystal of a tetragonal crystal and a rhombohedral crystal, and MPB is tetragonal in a case of Zr/Ti<0.52 and rhombohedral in a case of Zr/Ti>0.52.

It is noted that whether the perovskite crystal is rhombohedral, is in a preferential alignment of the tetragonal crystal in terms of the (100) plane, or a preferential alignment of the tetragonal crystal in terms of the (001) plane can be determined from the peak angle of XRD. In a case where a general CuKα ray is used as the X-ray source, a single (200) peak is generated in the vicinity of 2θ=44.5° in a case where the perovskite-type oxide is PZT and the perovskite crystal is rhombohedral. On the other hand, in a case where the perovskite-type oxide is PZT and is tetragonal, a (002) peak is generated in the vicinity of 44.8°, and a (002) peak is generated in the vicinity of 45.5°. However, the separation of the peaks is difficult since the peak angles are close to each other. For example, the above-described peaks can be separated by carrying out an XRD analysis with higher resolution using synchrotron light, and it is possible to distinguish between rhombohedral, tetragonal in a preferential alignment in terms of the (100) plane, and tetragonal in a preferential alignment in terms of the (001) plane.

The thickness t of the piezoelectric film 15 is, for example, 0.2 μm to 5 μm; however, it is preferably 1 μm or more. It is preferable that the thickness ta of the first region 15a of the piezoelectric film 15 is 1 μm or more.

The thickness t of the piezoelectric film 15 can be estimated from a cross-sectional TEM image. In this example, the distance between interfaces, each of which is an interface between each of two layers adjacent to the piezoelectric film 15 and the piezoelectric film 15, is the thickness t of the piezoelectric film 15, where the two layers are respectively the lower electrode layer 12 and the upper electrode layer 18. A method of measuring the thickness ta of the first region 15a and the thickness tb of the second region 15b of the piezoelectric film 15 will be described later.

The first angle α and the second angle β, which are formed by the (100) plane orientation or the (001) plane orientation of the perovskite structure and the normal direction N of the substrate surface 10a are defined as values calculated by rocking curve measurement by X-ray diffraction. Specifically, the first angle α is a value calculated from the split width of the (100) or (001) diffraction peak or a diffraction peak related to (100) or (001) regarding the first region 15a (see Examples). Similarly, the second angle β is a value calculated from the split width of the (100) or (001) diffraction peak or a diffraction peak related to (100) or (001) regarding the second region 15b (see Examples). The diffraction peak related to (100) or (001) is, for example, a (200) or (002) diffraction peak.

Figure 3:
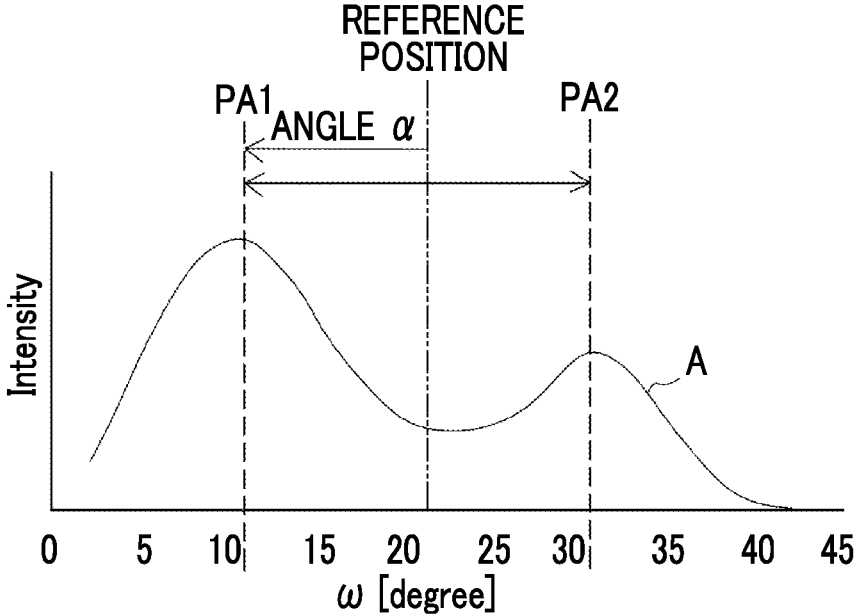
FIG. 3 is a schematic view of a rocking curve of a first region of the piezoelectric film.
Figure 4:
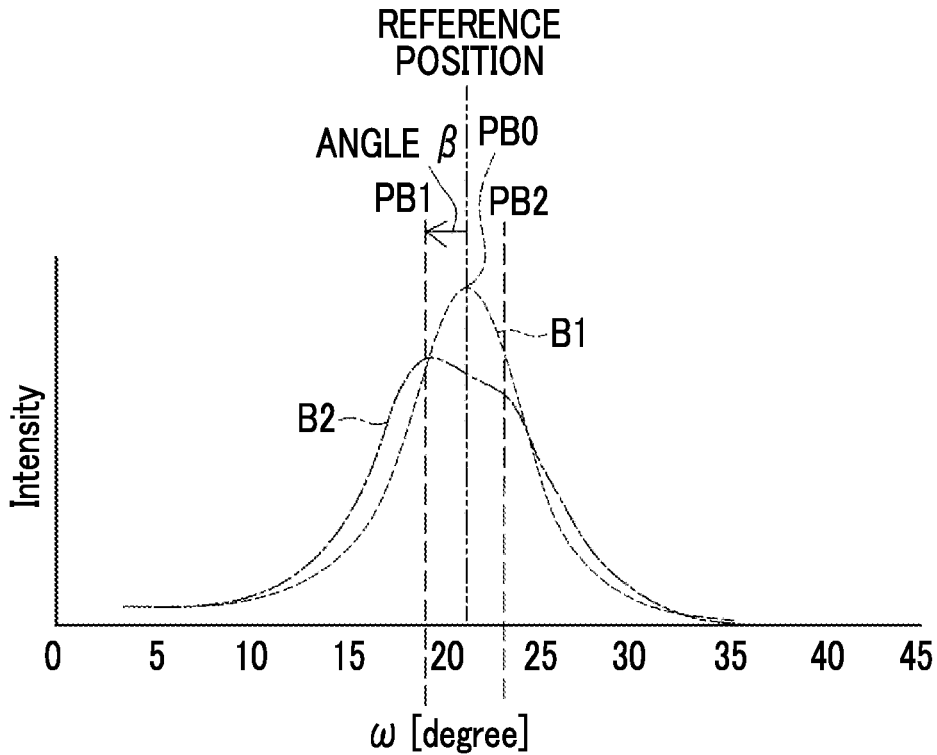
FIG. 4 is a schematic view of a rocking curve of a second region of the piezoelectric film.

FIG. 3 is a view schematically illustrating a profile A of intensity with respect to an angle ω, which is obtained in a case where a rocking curve is measured for the first perovskite crystal 17A. FIG. 4 is a view schematically illustrating profiles B1 and B2 of intensity with respect to an angle ω, which is obtained in a case where a rocking curve is measured for the second perovskite crystal 17B. FIG. 3 and FIG. 4 each schematically illustrate an example of the rocking curve relating to the (200) or (002) diffraction peak that is generated at ω=22.5° (hereinafter, referred to as a reference position), in a case of a perovskite crystal in which the crystal axis (the a axis or the c axis) is parallel to the normal direction N of the substrate surface 10a.

In a case where the crystal axis is tilted with respect to the normal direction N, a peak is generated at a position deviating from the reference position in the rocking curve. The difference between the angles at the reference position and the peak position corresponds to a tilt angle of the (100) plane orientation or the (001) plane orientation with respect to the normal direction N.

As shown in FIG. 2, since the crystal axis A is tilted by the first angle α with respect to the normal direction N in the first perovskite crystal 17A, peaks PA1 and PA2 are respectively generated at positions separated by 5° or more from the reference position in the profile A of the rocking curve shown in FIG. 3. It is noted that as shown in FIG. 2, since the direction in which the crystal axis A is tilted is random, the profile A has peaks PA1 and PA2 on the low angle side and the high angle side, respectively, with respect to the reference position. In general, since the diffraction intensity is increased on the low angle side, the peak PA1 has a higher intensity than the peak PA2. The first angle α is the difference between angles at the peak PA1 which is the maximum peak and at the reference position, among the two peaks.

The crystal axis B is tilted by the second angle β with respect to the normal direction N in the second perovskite crystal 17B. In a case where the second angle β is 0°, that is, in a case where the crystal axis B is parallel to the normal direction N, the rocking curve has a single peak PB0, and the peak PB0 substantially matches the reference position as shown in the profile B1 in FIG. 4. Further, in a case where the second angle β is more than 0° and less than 5°, peaks PB1 and PB2 are respectively generated at positions separated by less than 5° from the reference position as shown in the rocking curve of the profile B2 in FIG. 4. Here, the second angle R is the difference between angles at the peak PB1 which is the maximum peak and at the reference position, among the two peaks.

As shown in FIG. 3 and FIG. 4, the first perovskite crystal 17A having the crystal axis A tilted by the first angle α and the second perovskite crystal 17B having the crystal axis B tilted by the second angle β can be distinguished by the rocking curve measurement. In the piezoelectric film 15, the boundary between the first region 15a and the second region 15b is specified by repeating polishing from the surface of the piezoelectric film 15 and measuring the rocking curve on the surface exposed by polishing. In a case where the rocking curve measurement is carried out on the actual piezoelectric film 15, not only a case of a profile in which a single peak or two peaks are generated but also a case of a profile having three or more peaks may be observed. In a case where there are a plurality of peaks in a profile obtained by the rocking curve measurement, the difference between angles at the maximum peak and the reference position is set to the angle formed by the normal direction N and the crystal axis of the perovskite crystal on the exposed surface which has been subjected to the rocking curve measurement. In a case where this angle is 5° or more, it is regarded that the crystal constituting the exposed surface contains the first perovskite crystal 17A as a main component, and the thickness position of the exposed surface is regarded as the first region 15a. On the other hand, in a case where this angle is less than 5°, it is regarded that the crystal constituting the exposed surface contains the second perovskite crystal 17B as a main component, and the thickness position of the exposed surface is regarded as the second region 15b.

That is, the first region 15a containing the first perovskite crystal 17A as a main component refers to a region having the maximum peak at a position separated by 5° or more from the reference position in the profile obtained by the rocking curve measurement. The second region 15b containing the second perovskite crystal 17B as a main component refers to a region having the maximum peak at a position separated by less than 5° from the reference position in the profile obtained by the rocking curve measurement.

In a case where the rocking curve measurement is carried out at each depth position where the piezoelectric film 15 has been polished from the surface in the thickness direction, it is regarded that a region in which the difference between angles at the maximum peak of the profile and the reference position is 5° or more is the first region 15a and the depth position where the difference between angles at the maximum peak of the profile and the reference position is less than 5° is regarded as the boundary AB between the first region 15a and the second region 15b. The thickness from the surface of the piezoelectric film 15 to the boundary AB is defined as the thickness ta of the first region 15a, and the thickness from the boundary AB to the boundary with the adjacent layer (here, the lower electrode layer 12) is defined as the thickness tb of the second region 15b. It is noted that a method of polishing the piezoelectric film 15 may be physical polishing, may be dry etching, or may be chemical polishing in which etching is carried out using a chemical liquid.

The perovskite oxide is represented by General Formula $ABO_3$.

In the general formula, A is an A site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B site element, which is one of Ti, Zr, vanadium (V), niobium (Nb), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

In the general formula, O is oxygen.

Regarding A:B:O, a reference ratio is 1:1:3; however, the ratio may deviate within a range in which a perovskite structure is obtained.

In the perovskite-type oxide constituting the piezoelectric film 15, it is preferable that the main component of the A site is Pb. Here, "Pb is the main component of the A site" means that Pb is a component that occupies 80 at % or more of the A site.

The perovskite-type oxide constituting the piezoelectric film 15 is more preferably a lead zirconate titanate (PZT) type that contains Pb, Zr, Ti, and oxygen (O). In particular, it is preferable that the perovskite-type oxide is a compound represented by General Formula (1), which contains an additive B in the B site of PZT.

$$Pb\{(Zr_xTi_{1-x})_{1-y}B1_y\}O_3 \tag{1}$$

Here, B1 is preferably one or more elements selected from vanadium (V), niobium (Nb), tantalum (Ta), antimony (Sb), molybdenum (Mo), and tungsten (W). It is most preferable that B1 is Nb. Here, $0<x<1$ and $0<y<0.4$ are satisfied. Here, regarding $Pb:\{(Zr_xTi_{1+x})_{1-y}B_y\}:O$, a reference ratio is also 1:1:3; however, the ratio may deviate within a range in which a perovskite structure is obtained.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A site element.

In the piezoelectric film 15, it is preferable that the first region 15a and the second region 15b are composed of the same element. In a case where the first region 15a and the second region 15b are composed of the same element, the compositional ratios in the compositions of both regions may be the same or different. In a case where the piezoelectric film 15 contains a perovskite-type oxide in which the main component of the A site is Pb, it is preferable that the Pb compositional ratio in the second region 15b is larger than the Pb compositional ratio in the first region 15a. Although the detailed mechanism is unknown, in a case where the Pb compositional ratio of the second region 15b is larger than the Pb compositional ratio of the first region 15a, a higher piezoelectric constant is obtained as compared with (see Examples) a case where the Pb compositional ratio of the second region 15b is equal to or less than the Pb compositional ratio of the first region 15a.

The piezoelectric film 15 is which has been formed through the film formation by, for example, a vapor phase growth method using plasma, such as a sputtering method, an ion plating method, a plasma CVD method, or a pulse laser deposition method (PLD method). In a case of changing the film forming conditions during the formation of the piezoelectric film 15, it is possible to continuously form the first region 15a and the second region 15b, between which the tilt directions of the crystal axes are different. In a case of carrying out film formation using this vapor phase growth method, it is possible to obtain the piezoelectric film 15 that does not have a grain boundary between the first region 15a and the second region 15b, which is caused by lamination and is substantially parallel to the substrate 10. It is particularly preferable that the film forming method is a sputtering method and the piezoelectric film 15 is a sputter film.

In a case where the piezoelectric film 15 is formed through film formation by a sputtering method, it is possible to change the tilt angle of the crystal axis with respect to the normal direction, for example, by changing the substrate temperature. The higher the substrate temperature is, the larger angle can be formed. In addition, it is possible to change the tilt angle not only by controlling the substrate temperature but also by changing the gas pressure and/or the input power. To change the film forming conditions in a case of subjecting the first region 15*a* and the second region 15*b* to film formation, the second region 15*b* may be subjected to film formation, and then the film formation may be temporarily stopped to change the substrate temperature before the first region 15*a* is subjected to film formation. Alternatively, the substrate temperature may be changed while the first region 15*a* is being subjected to film formation.

It is noted that the presence or absence of the grain boundary can be specified by the presence or absence of lateral streaks substantially parallel to the substrate 10 in a transmission electron microscope (TEM) image of the cross section of the piezoelectric film 15. That is, in a state in which the lateral streaks substantially parallel to the substrate 10 are not observed in the cross-sectional TEM image of the piezoelectric film 15, it can be determined that there is no grain boundary. That is, in a case where a film is formed by such a vapor phase growth method, the boundary AB between the first region 15*a* and the second region 15*b* cannot be specified by the TEM image or the like.

The piezoelectric film 15 may be formed by a sol-gel method. However, in the case of the sol-gel method, it is necessary to repeat coating and sintering a plurality of times in order to form a film having a thickness of a certain thickness or more (for example, 500 nm or more) as the piezoelectric film 15. In a case where the coating and the sintering are repeated a plurality of times in the production, lateral streaks due to the grain boundary due to the lamination are generated in the piezoelectric film. With the long-term use of the piezoelectric element, cracks originating from this grain boundary may be generated. On the other hand, in a case of a film having no grain boundary, which is the piezoelectric film 15 formed by a vapor phase growth method, it is possible to suppress the generation of cracks due to the generation of thermal stress, streaks, and cracks originating from defects, whereby high durability is exhibited.

As illustrated in FIG. 1, the piezoelectric film 15 may contain a pyrochlore phase 16 having a diameter of about 20 nm or less at an interface between the lower electrode layer 12 and the piezoelectric film 15. Since the pyrochlore phase 16 may be a starting point for cracks or the like, it is preferable not to use the pyrochlore phase 16. In a case of providing an alignment control layer or the like as an underlying layer of the piezoelectric film 15 on the lower electrode layer 12, it is also possible to realize the piezoelectric film 15 that contains substantially no pyrochlore phase 16. On the other hand, in a case where the piezoelectric film 15 is formed through the film formation directly on the lower electrode layer 12 such as Ir, although it is possible to suppress the pyrochlore phase 16 depending on the film forming conditions of the piezoelectric film 15 or the like, it is difficult to completely eliminate the pyrochlore phase 16.

The pyrochlore phase 16 which has been sufficiently suppressed is not uniformly formed on the surface of the lower electrode layer 12 but is partially grown as illustrated in FIG. 1. The thickness of the pyrochlore phase 16 is set to a value calculated from a TEM image obtained by imaging a TEM image. In the piezoelectric film 15, the contrast in the TEM image differs between the pyrochlore phase and the perovskite phase, and thus it is possible to specify the region of the pyrochlore phase. The thickness of the pyrochlore phase shall be calculated as an average thickness since the pyrochlore phase is not uniformly formed on the surface of the lower electrode layer. As a specific method for calculating the thickness of the pyrochlore phase 16, the method disclosed in JP2010-034448A is applied.

Each layer of the piezoelectric element 1 other than the piezoelectric film 15 will be described.

The substrate 10 is not particularly limited, and examples thereof include substrates such as silicon, glass, stainless steel, yttrium-stabilized zirconia, alumina, sapphire, and silicon carbide. As the substrate 10, a laminated substrate having a $SiO_2$ oxide film formed on the surface of the silicon substrate, such as a thermal oxide film-attached silicon substrate, may be used. It is noted that in a tetragonal perovskite crystal, the alignment in terms of the a axis and the alignment in terms of the c axis can be separately created by using substrates having linear expansion coefficients different from each other.

The lower electrode layer 12 is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), titanium (Ti), molybdenum (Mo), tantalum (Ta), aluminum (Al), copper (Cu), and silver (Ag), and metal oxides, as well as combinations thereof. In addition, indium tin oxide (ITO), $LaNiO_3$, $SrRuO_3$ (SRO), or the like may be used. Various intimate attachment layers or seed layers may be included between the piezoelectric film 15 and the lower electrode layer 12 and between the lower electrode layer 12 and the substrate 10.

The upper electrode layer 18 is paired with the lower electrode layer 12 and is an electrode for applying a voltage to the piezoelectric film 15. The main component of the upper electrode layer 18 is not particularly limited, and examples thereof include, in addition to the materials exemplified in the lower electrode layer 12, electrode materials that are generally used in a semiconductor process such as chromium (Cr) and a combination thereof. However, it is preferable to use an oxide conductor in a region in contact with the piezoelectric film 15. Specific examples thereof include $LaNiO_3$ and ZnO which has undergone doping, in addition to ITO, an iridium oxide, and SRO. In a case of providing an oxide conductor in a region of the upper electrode layer 18, the region being in contact with the piezoelectric film 15, oxygen elements are less likely to come out from the piezoelectric film 15 as compared with a case where a metal is in direct contact with the piezoelectric film 15, and thus an effect of suppressing decreases in piezoelectric characteristics can be obtained.

The layer thicknesses of the lower electrode layer 12 and the upper electrode layer 18 are not particularly limited, and they are preferably about 50 nm to 300 nm and more preferably 100 nm to 300 nm.

As described above, in the piezoelectric laminate 5 and the piezoelectric element 1 according to the present embodiment, the piezoelectric film 15 contains a perovskite oxide, and the piezoelectric film 15 includes the first region 15*a* and the second region 15*b* that is provided between the first region 15*a* and the lower electrode layer 12. Since the first region 15*a* contains, as a main component, the first perovskite crystal in which the first angle α formed by the (100) plane orientation or the (001) plane orientation and the normal direction is 5° or more and 30° or less, a high piezoelectric constant can be obtained as compared with a case where it contains, as a main component, a perovskite crystal in which the (100) plane orientation or the (001) plane orientation is substantially parallel to the normal direction. On the other hand, as described above, the piezoelectric film in which the alignment plane is tilted by 5° or more from the normal direction has a problem that the withstand voltage is low while exhibiting a high piezoelectric constant. However, the piezoelectric element 1 and the piezoelectric laminate 5 according to the present embodiment include, on the lower electrode layer 12 side of the first region 15a, the second region 15b having a thickness of 30 nm or more which contains, as a main component, the second perovskite crystal in which the second angle formed by the (100) plane orientation or the (001) plane orientation and the normal direction is less than 5°. Due to such a configuration, the piezoelectric element 1 and the piezoelectric laminate 5 have a high withstand voltage as compared with the piezoelectric element in the related art, including a piezoelectric film in which the crystal axis is tilted by 5° or more from the normal direction, which has been described in the section of "Description of the Related Art". This is presumed to be because it is possible to improve the adhesiveness between the piezoelectric film 15 and the adjacent layer (the lower electrode layer 12 in the above example) on the lower electrode layer 12 side thereof since the second region 15b is provided. In particular, in a case of setting the thickness tb of the second region 15b to 30 nm, an effect of improving the adhesiveness is obtained.

In a case where the first angle is 5° or more and 15° or less in the first region 15a of the piezoelectric film 15, a higher piezoelectric constant can be obtained.

In the first perovskite crystal 17A of the first region 15a, in a case where the angle formed by the (100) plane orientation and the normal direction is 5° or more and 30° or less, a high piezoelectric constant can be obtained as compared with a case where the angle formed by the (001) plane orientation and the normal direction is 5° or more and 30° or less.

In a case where the first perovskite crystal 17A in the first region 15a is rhombohedral, a high piezoelectric constant is obtained as compared with a case where the first perovskite crystal 17A is another crystal system.

In a case where the piezoelectric film 15 does not have a grain boundary between the first region 15a and the second region 15b, which is caused by lamination and is substantially parallel to the substrate 10, the generation of cracks, which occurs in a case where a grain boundary is included, is suppressed, and high durability can be obtained.

In a case where the piezoelectric film 15 is a sputter film, a film having no grain boundary can be obtained.

In a case where the thickness of the first region 15a of the piezoelectric film 15 is 1 m or more, a large displacement magnitude can be obtained, and a piezoelectric element suitable for practical use can be obtained.

EXAMPLES

Hereinafter, specific examples and comparative examples of the piezoelectric element according to the present disclosure will be described. First, a production method for a piezoelectric element of each example will be described. A radio frequency (RF) sputtering device was used for the film formation of each layer. The description of the manufacturing method will be made with reference to the reference numerals of the respective layers of the piezoelectric element 1 illustrated in FIG. 1.

Film Formation of Lower Electrode Layer

In Examples 1 to 8, 10, 11, 12 and Comparative Examples 1 to 4, a Si wafer using a thermal oxide film on the surface was used as the substrate 10, and the lower electrode layer 12 was formed through film formation on the thermal oxide film of the substrate 10. A two-layer structure in which the TiW layer and the Ir layer were laminated in this order from the substrate 10 side was provided. The TiW layer was set to 20 nm, and a film of Ir was formed at 150 nm.

On the other hand, in Example 9, a YSZ (stabilized zirconia) substrate was used as the substrate 10. In Example 9, the lower electrode layer 12 was formed under the same conditions as in Example 1 except for the kind of the substrate 10.

The sputtering conditions for each layer were as follows. It is noted that the conditions of the distance of 100 mm between the target and the substrate and the substrate set temperature of 350° C. were the same.

Sputtering Conditions for TiW Layer
Target input power: 600 W
Ar gas pressure: 0.5 Pa
Sputtering Conditions for Ir Layer
Target input power: 600 W
Ar gas pressure: 0.1 Pa
Formation of Piezoelectric Film In Examples 1 to 7 and Comparative Examples 1 to 4, the substrate 10 attached with the lower electrode layer 12 was placed in an RF sputtering device, and a film of a PZT film doped with Nb, having a thickness of 2 μm and an Nb doping amount to B site of 12 at %, was formed by using a PZT target doped with Nb as the piezoelectric film 15. The first region 15a and the second region 15b were separately formed, respectively, according to the substrate temperatures. The substrate temperature was set to 525° C. in a case of subjecting the second region 15b to film formation, and in a case of subjecting the first region 15a to film formation, the substrate temperature was set to a value within a range of 575° C. to 750° C., at which the first angle α of each example shown in Table 1 was obtained. The higher the substrate temperature, the larger the tilt angle of the crystal axis from the normal direction.

The film formation time was adjusted such that the thickness ta of the first region 15a and the thickness tb of the second region 15b were respectively the values of each example shown in Tables 1 to 3. It is noted that although Tables 1 to 3 show each of the design thicknesses, an error from the thickness after film formation is about ±5%.

In order to control the crystal system in Examples 8 and 9, a Ti chip was placed on the PZT target doped with Nb, which had been used at the time of the formation of the piezoelectric film of Examples 1 to 7, and the amount of Ti at the B site was adjusted to be large as compared with the MPB composition. Except for this point, the same procedure as in Example 2 was carried out.

In Examples 10, 11, and 12, a target having a Pb compositional ratio different from the PZT target doped with Nb, which had been used in the formation of the piezoelectric film of Examples 1 to 7, was used for subjecting the second region 15b into film formation. Except for this point, the same procedure as in Example 2 was carried out. In Examples 10, 11, and 12, the respective Pb compositional ratios in the second region 15b were as shown in Table 3.

The sputtering conditions common to each of Examples during the sputtering of the piezoelectric film 15 were as follows.

Sputtering conditions for piezoelectric film (common portion)

Distance between target and substrate: 60 mm

Target input power: 500 W $Ar/O_2$ gas pressure: 0.3 Pa, an $Ar/O_2$ mixed atmosphere (02 volume fraction: 2.0%)

Film Formation of Upper Electrode Layer

Next, the substrate 10 after forming the piezoelectric film 15 was placed in a film forming chamber of the RF sputtering device, and by using an indium tin oxide (ITO) target, an ITO layer was formed into a film having a thickness of 200 nm as the upper electrode layer 18. It is noted that before the film formation of the upper electrode layer 18, a lift-off pattern for an evaluation sample was prepared on the piezoelectric film 15, and the upper electrode layer 18 was formed on the lift-off pattern. The film forming conditions for the upper electrode layer 18 were as follows.

Sputtering Conditions for Upper Electrode Layer

Distance between target and substrate: 100 mm

Target input power: 200 W

Vacuum degree: 0.3 Pa, an $Ar/O_2$ mixed gas (02 volume fraction: 5%)

Substrate set temperature: room temperature (RT)

Substrate temperature: room temperature

Formation of Electrode Pattern for Evaluation

After the formation of the upper electrode layer 18, the upper electrode layer 18 was lifted off along the lift-off pattern according to the lift-off method to carry out the patterning of the upper electrode layer 18.

Through the above steps, the piezoelectric laminated substrate of each example, having the lower electrode layer 12, the piezoelectric film 15, and the patterned upper electrode layer 18 on the substrate 10, was produced.

Measurement of Piezoelectric Constant

Preparation of Measurement Sample

A strip-shaped portion having a size of 2 mm×25 mm was cut out from the laminated substrate to produce a cantilever.

Measurement

According to the method described in I. Kanno et. al., Sensor and Actuator A 107 (2003) 68, the piezoelectric constant $d_{31}$ [pm/V] was measured using the cantilever, by using an applied voltage of a sine wave of ~10 V±10 V, that is, a bias voltage of –10 V and an applied voltage of a sine wave having an amplitude of 10 V. The measurement results are shown in Tables 1 to 3.

Measurement of Dielectric Breakdown Voltage (Withstand Voltage)

Preparation of Measurement Sample

The laminated substrate was subjected to dicing processing to a size of one-inch (25 mm) square to produce a piezoelectric laminate of one-inch square. It is noted that at the time of film formation of the upper electrode layer 18, a metal mask partially having a circular opening having a diameter of 400 μm was used to form a circular upper electrode layer 18 having a diameter of 400 μm. Then, a one-inch square in which a circular upper electrode layer 18 was provided at the center was cut out and used as a sample for the measurement of the withstand voltage.

Measurement

The lower electrode layer 12 was grounded, a negative voltage was applied to the upper electrode layer 18 at a rate of change of –1 V/sec, and a voltage at which a current of 1 mA or more flowed was regarded as the withstand voltage. Ten samples were prepared for each example, the measurements were carried out a total of 10 times, and an average value (in terms of absolute value) therefrom is shown in Tables 1 to 3 as the withstand voltage [V].

Tilt Angle of (100) or (001) Plane Orientation of Piezoelectric Film

Figure 5:
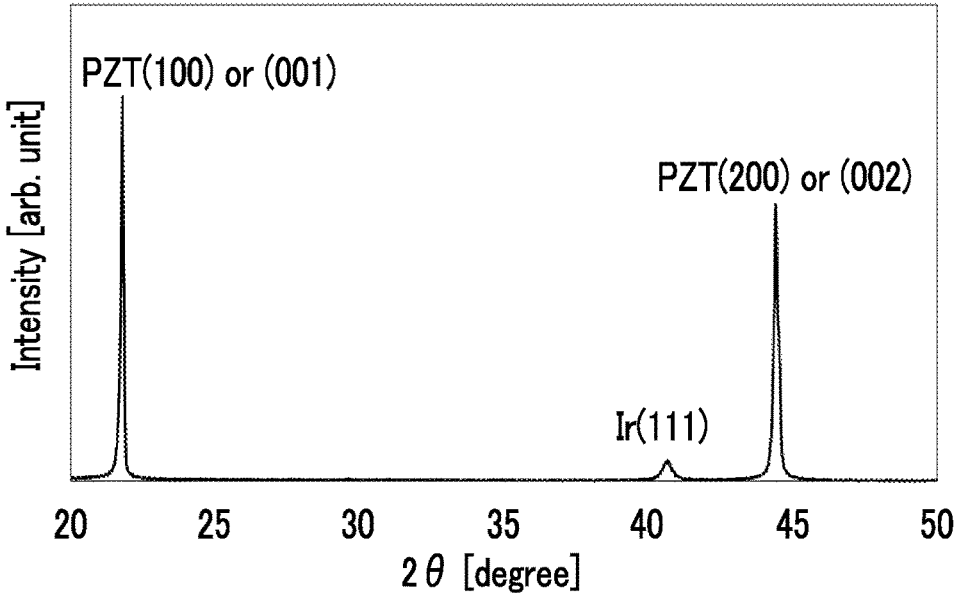
FIG. 5 is an XRD chart of Example 2.
Figure 6:
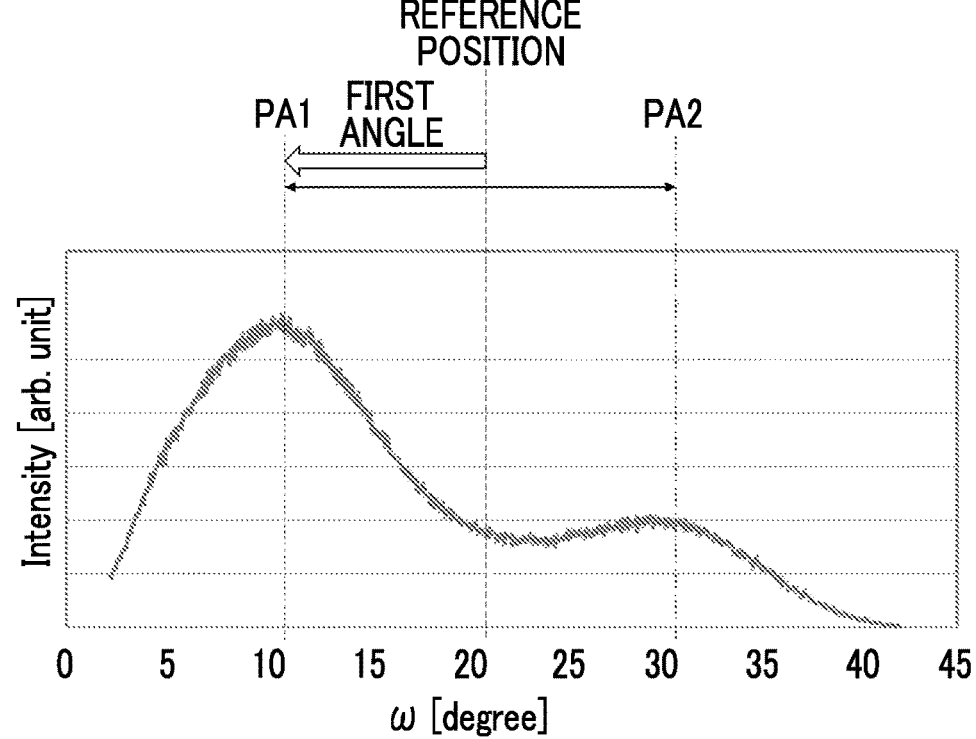
FIG. 6 is a rocking curve of a first region of Example 2.
Figure 7:
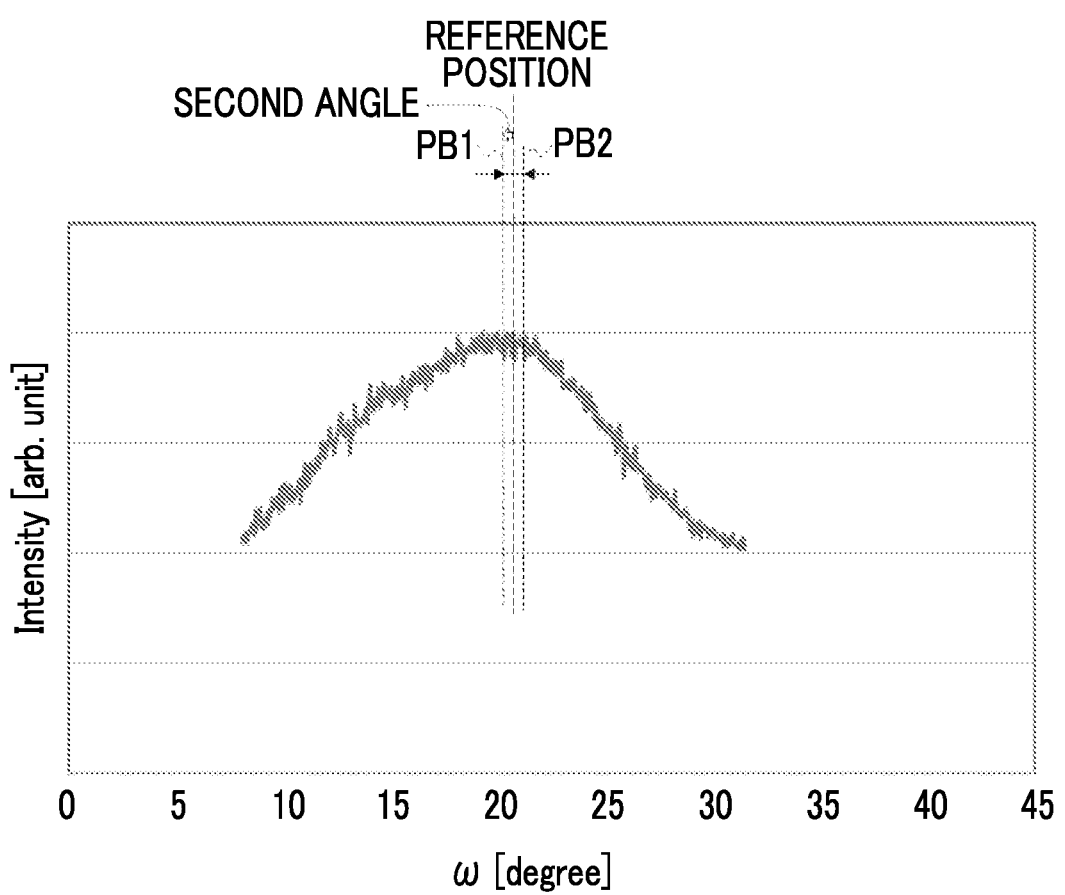
FIG. 7 is a rocking curve of a second region of Example 2.

In Examples and Comparative Examples, the (200) or (002) peak of the piezoelectric film (PZT) was subjected to the rocking curve measurement by using RINT-ULTIMA III manufactured by RIGAKU Corporation, thereby measuring the tilt angle of the (100) or (001) plane orientation. Specifically, the rocking curve was measured, the peak position of the (200) or (002) diffraction in a case where the crystal axis was not tilted was set as the reference position, and the tilt angle of the (100) or (001) plane orientation was determined from the deviation of the peak from the reference position. FIG. 5 shows a profile obtained by measuring a rocking curve of a piezoelectric film of Example 2 in a state where the surface of the piezoelectric film before forming the upper electrode layer is unpolished. FIG. 6 is a profile obtained by subjecting the piezoelectric film of Example 2 to the rocking curve measurement after polishing 1,900 nm from the surface of the piezoelectric film.

In the profile shown in FIG. 5, the first peak PA1 and the second peak PA2 are present in the vicinity of 100 and 30°, respectively. The reference position is 22.2°, and a deviation of the first peak PA1 which is the maximum peak from the reference position 22.2°, that is, the difference between angles at the reference position and the first peak PA1 is substantially 10°. Since the difference between angles is 5° or more, this means the first angle α, which means that the surface of the piezoelectric film is the first region 15a.

Although the profile shown in FIG. 6 looks like a substantially single peak, there are the first peak PB1 and the second peak PB2 at positions close to the reference position which is interposed therebetween. The difference between angles at the first peak PB1, which is the maximum peak and at the reference position is substantially 2°. Since the difference between angles is less than 5°, this is the second angle β, which means that the position at 1,900 nm from surface is the second region 15b.

Regarding each Example, the first angle α and the second angle β, which are obtained by subjecting the first region 15a and the second region 15b to rocking curve measurements, respectively, are shown in Tables 1 to 3.

Measurement of Crystal System

Using synchrotron light, the piezoelectric films 15 of Examples 2, 8, and 9 were specified by XRD analysis in the vicinity of the (200) and (002) peaks of the perovskite structure. The results are shown in Table 2.

Table 1 shows the configurations of the piezoelectric films 15 of Examples 1 to 7 and Comparative Examples 1 to 4 and the evaluation results of the piezoelectric characteristics.

TABLE 1

| | Piezoelectric film 15 | | | | Piezoelectric characteristics | |
| | Second region 15b | | First region 15a | | Piezo- | With- |
| | Thickness tb [nm] | Second angle β [°] | Thickness ta [nm] | First angle α [°] | electric constant [pm/V] | stand voltage [V] |
| Example 1 | 30 | 2 | 1970 | 10 | 220 | 75 |
| Example 2 | 100 | 2 | 1900 | 10 | 220 | 90 |
| Example 3 | 300 | 2 | 1700 | 10 | 210 | 95 |
| Example 4 | 500 | 2 | 1500 | 10 | 200 | 100 |

TABLE 1-continued

| | Piezoelectric film 15 | | | | Piezoelectric characteristics | |
| | Second region 15b | | First region 15a | | Piezo- | With- |
| | Thickness tb [nm] | Second angle β [°] | Thickness ta [nm] | First angle α [°] | electric constant [pm/V] | stand voltage [V] |
|---|---|---|---|---|---|---|
| Example 5 | 100 | 2 | 1900 | 5 | 200 | 90 |
| Example 6 | 100 | 2 | 1900 | 5 | 210 | 90 |
| Example 7 | 100 | 2 | 1900 | 30 | 190 | 90 |
| Comparative Example 1 | — | — | 2000 | 10 | 220 | 50 |
| Comparative Example 2 | — | — | 2000 | 5 | 200 | 5 |
| Comparative Example 3 | 2000 | 2 | — | — | 180 | 100 |
| Comparative Example 4 | 15 | 2 | 1985 | 10 | 220 | 50 |

Comparative Examples 1 and 2 have a piezoelectric film that does not include the second region 15b and has only a region in which the angle formed by the crystal axis and the normal direction N is 5° or more. On the contrary, Comparative Example 3 has a piezoelectric film that has only a region in which the angle formed by the crystal axis and the normal direction is less than 5°. In Comparative Example 1, the piezoelectric constant is high, but the withstand voltage is low; however, in Comparative Example 3, the withstand voltage is high, but the piezoelectric constant is low.

As shown in Table 1, in Examples 1 to 7 in which the second region 15b having a thickness of 30 to 500 nm is provided, the withstand voltage is increased as compared with Comparative Examples 1 and 2 in which the second region 15b is not provided, and the piezoelectric constant is high as compared with Comparative Example 3 in which the first region 15a is not provided. That is, in Examples 1 to 7, both a high piezoelectric constant and a high withstand voltage can be achieved. It is noted that in Comparative Example 4, although the first region 15a and the second region 15b are provided, the thickness of the second region 15b is less than 30 nm. From this result, it is revealed that in a case where the thickness of the second region 15b is less than 30 nm, the effect of improving the withstand voltage cannot be obtained.

Table 2 shows the crystal systems of the piezoelectric films of Examples 2, 8, and 9, and the evaluation results of the piezoelectric characteristics thereof.

TABLE 2

| | Piezoelectric film 15 | | | | | | Piezoelectric characteristics | |
| | Second region 15b | | | First region 15a | | | | |
| | Crystal system | Thickness tb [nm] | Second angle β [°] | Crystal system | Thickness ta [nm] | First angle α [°] | Piezoelectric constant [pm/V] | Withstand voltage [V] |
|---|---|---|---|---|---|---|---|---|
| Example 2 | Rhombohedral (100) | 100 | 2 | Rhombohedral (100) | 1900 | 10 | 220 | 90 |
| Example 8 | Tetragonal (100) | 100 | 2 | Tetragonal (100) | 1900 | 10 | 210 | 90 |
| Example 9 | Tetragonal (001) | 100 | 2 | Tetragonal (001) | 1900 | 10 | 200 | 90 |

As shown in Table 2, in a case where the crystal system of the piezoelectric film is rhombohedral as shown in Example 2, the obtained results are such that the piezoelectric constant is high as compared with Examples 8 and 9 which are tetragonal. Further, from the comparison between Examples 8 and 9, the obtained results are such that even in the case of the same tetragonal crystal, the piezoelectric constant of Example 8 which in the preferential alignment in terms of the (100) plane is higher than that of Example 9 which in the preferential alignment in terms of the (001) plane.

Table 3 shows the configurations of the piezoelectric films of Examples 2 and 10 to 12 and the evaluation results of the piezoelectric characteristics.

TABLE 3

| | Piezoelectric film 15 | | | | | | Piezoelectric characteristics | |
| | Second region 15b | | | First region 15a | | | | |
| | Pb/B site element | Thickness tb [nm] | Second angle β [°] | Pb/B site element | Thickness ta [nm] | First angle α [°] | Piezoelectric constant [pm/V] | Withstand voltage [V] |
|---|---|---|---|---|---|---|---|---|
| Example 2 | 1.12 | 100 | 2 | 1.1 | 1900 | 10 | 220 | 90 |
| Example 10 | 1.08 | 100 | 2 | 1.1 | 1900 | 10 | 210 | 80 |

TABLE 3-continued

| | Piezoelectric film 15 | | | | | Piezoelectric | |
| | Second region 15b | | | First region 15a | | characteristics | |
| | Pb/B site element | Thickness tb [nm] | Second angle β [°] | Pb/B site element | Thickness ta [nm] | First angle α [°] | Piezoelectric constant [pm/V] | Withstand voltage [V] |
|---|---|---|---|---|---|---|---|---|
| Example 11 | 1.1 | 100 | 2 | 1.1 | 1900 | 10 | 210 | 90 |
| Example 12 | 1.14 | 100 | 2 | 1.1 | 1900 | 10 | 230 | 80 |

As shown in Table 2, as compared with a case where the Pb compositional ratio (Pb/B site element) in the second region 15b is equal to or lower than the Pb compositional ratio in the first region 15a as in Examples 10 and 11, a high piezoelectric constant is obtained in a case where the Pb compositional ratio in the second region 15b is higher than the Pb compositional ratio of the first region 15a as in Examples 2 and 12.

What is claimed is:

1. A piezoelectric laminate comprising, on a substrate in the following order:
a lower electrode layer; and
a piezoelectric film;
wherein the piezoelectric film contains a perovskite-type oxide,
the piezoelectric film includes a first region in which the perovskite-type oxide contains, as a main component, a first perovskite crystal in which a first angle formed by a (100) plane orientation or a (001) plane orientation and a normal direction of a surface of the substrate is 5° or more and 30° or less, and includes a second region provided between the first region and the lower electrode layer, in which the perovskite-type oxide contains, as a main component, a second perovskite crystal in which a second angle formed by the (100) plane orientation or the (001) plane orientation and the normal direction is less than 5°, and
a thickness of the second region is 30 nm or more.

2. The piezoelectric laminate according to claim 1, wherein in the first region of the piezoelectric film, the first angle is 5° or more and 15° or less.

3. The piezoelectric laminate according to claim 1, wherein the piezoelectric film does not have a grain boundary between the first region and the second region, which is caused by lamination and is substantially parallel to the substrate.

4. The piezoelectric laminate according to claim 1, wherein the piezoelectric film is a sputter film.

5. The piezoelectric laminate according to claim 1, wherein a thickness of the first region of the piezoelectric film is 1 μm or more.

6. The piezoelectric laminate according to claim 1, wherein in the first perovskite crystal in the first region, a plane orientation that forms the first angle with the normal direction is the (100) plane orientation.

7. The piezoelectric laminate according to claim 1, wherein the first perovskite crystal in the first region is rhombohedral.

8. The piezoelectric laminate according to claim 1, wherein the perovskite-type oxide is represented by General Formula $ABO_3$, where A is an A site element, B is a B site element, and O is an oxygen element, and a main component of the A site element is Pb.

9. The piezoelectric laminate according to claim 1, wherein the perovskite-type oxide is a compound represented by General Formula (1), $$Pb\{(Zr_xTi_{1-x})_{y-1}B1_y\}O_3 \qquad (1)$$

$0<x<1$, $0<y<0.4$, and
B1 is one or more elements selected from V, Nb, Ta, Sb, Mo, and W.

10. The piezoelectric laminate according to claim 8, wherein a Pb compositional ratio in the second region is larger than a Pb compositional ratio in the first region.

11. A piezoelectric element comprising:
the piezoelectric laminate according to claim 1; and
an upper electrode layer provided on the piezoelectric film of the piezoelectric laminate.

* * * * *